United States Patent
Wang et al.

(10) Patent No.: US 7,695,982 B2
(45) Date of Patent: Apr. 13, 2010

(54) REFURBISHING A WAFER HAVING A LOW-K DIELECTRIC LAYER

(75) Inventors: Hong Wang, Cupertino, CA (US); Krishna Vepa, Danville, CA (US); Paul V. Miller, Cupertino, CA (US)

(73) Assignee: Applied Matreials, Inc., Santa Clara, CA (US)

( * ) Notice: Subject to any disclaimer, the term of this patent is extended or adjusted under 35 U.S.C. 154(b) by 477 days.

(21) Appl. No.: 11/737,708

(22) Filed: Apr. 19, 2007

(65) Prior Publication Data

US 2007/0190799 A1    Aug. 16, 2007

Related U.S. Application Data

(62) Division of application No. 11/037,647, filed on Jan. 18, 2005, now Pat. No. 7,208,325.

(51) Int. Cl.
*H01L 21/00* (2006.01)

(52) U.S. Cl. .................. 438/4; 438/951; 438/745; 438/756; 257/E21.025; 257/E21.034; 257/E21.035

(58) Field of Classification Search .......... 438/745, 438/756, 459, 977, 4, 951; 257/E21.025, 257/E21.035, E21.034
See application file for complete search history.

(56) References Cited

U.S. PATENT DOCUMENTS

| | | | |
|---|---|---|---|
| 3,559,281 A * | 2/1971 | Mayberry et al. | 438/4 |
| 3,923,567 A | 12/1975 | Lawrence | |
| 4,062,102 A * | 12/1977 | Lawrence et al. | 438/4 |
| 4,321,284 A * | 3/1982 | Yakushiji | 438/622 |
| 4,679,299 A * | 7/1987 | Szluk et al. | 438/153 |
| 5,131,979 A | 7/1992 | Lawrence | |
| 5,429,711 A | 7/1995 | Watanabe et al. | |
| 5,700,179 A | 12/1997 | Hasegawa et al. | |
| 5,800,725 A | 9/1998 | Kato et al. | |
| 5,821,166 A | 10/1998 | Hajime et al. | |
| 5,920,764 A | 7/1999 | Hanson | |
| 5,942,445 A | 8/1999 | Kato et al. | |
| 5,951,374 A | 9/1999 | Kato et al. | |
| 6,248,667 B1 | 6/2001 | Kim et al. | |

(Continued)

FOREIGN PATENT DOCUMENTS

WO    WO 99/56310    11/1999

(Continued)

OTHER PUBLICATIONS

U.S. Appl. No. 11/237,327, filed Sep. 27, 2005, Kim et al.

(Continued)

*Primary Examiner*—M. Wilczewski
(74) *Attorney, Agent, or Firm*—Janah & Associates, P.C.

(57) ABSTRACT

A wafer comprising a low-k dielectric layer is refurbished for reuse. Initially, a removable layer is provided on the wafer. The low-k dielectric layer is formed over the removable layer. The overlying low-k dielectric layer is removed from the wafer by etching away the removable layer by at least partially immersing the wafer in an etching solution. Thereafter, another low-k dielectric layer can be formed over another removable layer.

22 Claims, 3 Drawing Sheets

U.S. PATENT DOCUMENTS

| | | |
|---|---|---|
| 6,276,997 B1 | 8/2001 | Li |
| 6,284,628 B1 | 9/2001 | Kuwahara et al. |
| 6,358,839 B1 | 3/2002 | Li et al. |
| 6,365,528 B1 | 4/2002 | Sukharev et al. |
| 6,372,609 B1 | 4/2002 | Aga |
| 6,387,809 B2 | 5/2002 | Toyama |
| 6,406,923 B1 | 6/2002 | Inoue et al. |
| 6,483,173 B2 | 11/2002 | Li et al. |
| 6,562,700 B1 | 5/2003 | Gu et al. |
| 6,569,777 B1 | 5/2003 | Hsu et al. |
| 6,583,026 B1 | 6/2003 | Allman et al. |
| 6,607,675 B1 | 8/2003 | Hshieh et al. |
| 6,632,478 B2 | 10/2003 | Gaillard et al. |
| 6,693,047 B1 | 2/2004 | Lu et al. |
| 6,762,132 B1 | 7/2004 | Yates |
| 6,881,590 B2 | 4/2005 | Wu |
| 6,933,239 B2 | 8/2005 | Ying et al. |
| 6,991,739 B2 | 1/2006 | Kawaguchi et al. |
| 7,037,351 B2 | 5/2006 | Li et al. |
| 2001/0013507 A1 | 8/2001 | Hosali et al. |
| 2002/0139387 A1 | 10/2002 | Yates |
| 2003/0064607 A1 | 4/2003 | Leu et al. |
| 2003/0166380 A1 | 9/2003 | Shibuki |
| 2003/0171233 A1 | 9/2003 | Abe et al. |
| 2004/0084412 A1 | 5/2004 | Waldfried et al. |
| 2004/0137748 A1 | 7/2004 | Jain et al. |
| 2004/0204329 A1 | 10/2004 | Abe et al. |
| 2005/0042842 A1 | 2/2005 | Lei et al. |
| 2006/0016786 A1 | 1/2006 | Tsui et al. |
| 2006/0042651 A1 | 3/2006 | Verhaverbeke et al. |
| 2006/0128151 A1 | 6/2006 | Ryu |
| 2006/0292707 A1 | 12/2006 | Goodner |
| 2007/0068900 A1 | 3/2007 | Kim et al. |
| 2007/0082497 A1 | 4/2007 | Lee et al. |
| 2007/0087580 A1 | 4/2007 | Kang et al. |

FOREIGN PATENT DOCUMENTS

| | | |
|---|---|---|
| WO | WO 2004/010494 A3 | 1/2004 |
| WO | WO 2007/038580 | 4/2007 |

OTHER PUBLICATIONS

Enad, C., Office Action dated Mar. 4, 2009, U.S. Appl. No. 11/737,706 entitled "Removing a low-k dielectric layer from a wafer by chemical mechanical polishing" (US).

Enad, C., Final Office Action dated Sep. 8, 2009, U.S. Appl. No. 11/737,706 entitled "Removing a low-k dielectric layer from a wafer by chemical mechanical polishing" (US).

Wilczewski, M., Office Action dated Mar. 5, 2009, U.S. Appl. No. 11/359,301 entitled "Removal of silicon oxycarbide from substrates" (US).

Wilczewski, M., Office Action dated Aug. 21, 2009, U.S. Appl. No. 11/737,663 entitled "Removing a low-k dielectric layer from a wafer" (US).

\* cited by examiner

REFURBISHING A WAFER HAVING A LOW-K DIELECTRIC LAYER

CROSS-REFERENCE

This application is a divisional of U.S. patent application Ser. No. 11/037,647, entitled "REFRESHING WAFERS HAVING LOW-K DIELECTRIC MATERIALS" to Wang et al, assigned to Applied Materials, Inc. and filed on Jan. 18, 2005 now U.S. Pat. No. 7,208,325, which is incorporated by reference herein and in its entirety.

BACKGROUND

Embodiments of the present invention relate to a method of removing a low-k dielectric layer from a wafer to refresh the wafer.

In the processing of substrates, such as semiconducting wafers and displays, a test wafer is often used to determine processing uniformity. During processing, a substrate is placed in a process chamber and suitable processing conditions are maintained in the chamber. Processing of the substrate can involve, for example, energizing a process gas to etch the substrate or deposit material on the substrate. The substrates are typically processed in a series of processing steps to form a final substrate product, which may be an integrated circuit having metal interconnect metal layers with dielectric material in between. To evaluate the results from one or more of the processing steps, a test wafer can be processed in the chamber in place of the production substrate. The test wafer can be processed to determine processing results such as the deposited film thickness uniformity and particle counts, and the process parameters can be modified according to the test results to provide improved processing performance. For example, for a deposition process, the test wafer may be processed to determine a thickness uniformity, composition and wafer stress of a deposited film.

In one testing method, test wafers are used to evaluate processing of a low-k dielectric material on a substrate. Low-k dielectric materials have a dielectric constant "k" that is lower than conventional dielectric materials, such as silicon oxide, and may typically have a 'k' value of less than about 3. Examples of low-k dielectric materials can comprise compositions of silicon, oxygen and carbon, and even hydrogen, such as for example, the "Black Diamond™" dielectric material, and such materials may be formed by a chemical vapor deposition method. Low-k dielectric layers can reduce an RC delay time in an integrated circuit, allowing corresponding increases in metal interconnect density. Accordingly, the formation of low-k dielectric layers having properties that meet the processing specification is important for the fabrication of high-density circuits, especially for circuits having feature sizes of less than about 100 nm.

After testing, the wafers used to evaluate low-k dielectric layer deposition processes can be refreshed, by removing the low-k layer and refurbishing the test wafer for subsequent process evaluations. Refreshing and reclamation of test wafers is desirable to cut down on the cost of providing fresh test wafer materials. Refreshing may also be a suitable method of reusing production wafers with low-k dielectric layers that were poorly processed. In one version, a wafer having a low-k dielectric layer is reclaimed by mechanically grinding the low-k dielectric material off the wafer, for example with a grinding wheel. In another version, a chemical solution is used to remove the material.

However, standard refreshing techniques often fail to suitably remove low-k dielectric materials. For instance, some low-k dielectric materials are difficult to remove chemically, as the combination of organic and inorganic elements renders the material less reactive with many chemical compositions, and many chemical compositions can convert the low-k dielectric material into a gummy residue on the wafer. Also, conventional means such as grinding can excessively scratch and otherwise damage the wafer surface. Surface damage can undesirably affect the deposition of a low-k dielectric layer on the surface, and alter the deposition testing results. As such, conventionally reclaimed wafers are often only suitable as mechanical-grade testing wafers, for example, for mechanical robot testing to evaluate wafer positioning, but may not be suitable as test-grade wafers for evaluating substrate processes. The conventional refreshing methods may also erode away an excessive amount of the wafer during the low-k removal process. This excessive erosion can limit the number of times the wafer can be reclaimed for re-use, before disposal of the wafer becomes necessary. Accordingly, conventional refreshing techniques do not always provide satisfactory removal of low-k dielectric materials to allow re-use of the wafers.

Thus, it is desirable to be able to reclaim a wafer having a low-k dielectric material. It is furthermore desirable to be able to refresh a test wafer to remove a low-k dielectric layer, to provide a fresh test wafer for testing low-k dielectric layer deposition processes. It is further desirable to completely remove residual low-k dielectric material from the test wafer in the refreshing process.

SUMMARY

A wafer having a low-k dielectric layer with a k value of less than about 3 and comprising silicon, oxygen and carbon, is refurbished. In the method, a removable layer is formed on the wafer. Thereafter, the low-k dielectric layer is formed over the removable layer. The removable layer is etched from the wafer by at least partially immersing the wafer in an etching solution, thereby also removing the overlying low-k dielectric layer from the wafer.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1A:
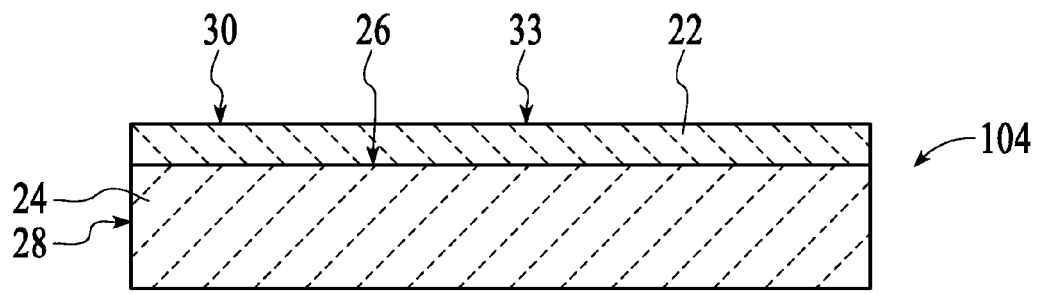
FIG. 1A is a partial sectional side view of an embodiment of a wafer having a low-k dielectric material thereon.

A cleaning process can be performed to remove a low-k dielectric layer 22 from a wafer 104, for example to allow the wafer 104 to be refreshed for re-use as a test wafer, or to allow re-processing of the wafer. The low-k dielectric layer 22 comprises a low-k dielectric material having a composition of carbon, silicon and oxygen, such as carbon-doped silicon oxide, and may even comprise an organosilicate glass (OSG). The low-k dielectric layer 22 may comprise a dielectric constant 'k' of less than about 3, such as from about 2.5 to about 2.8, and even less than about 2.4. The low-k dielectric layer 22 may be formed by a deposition process such as a chemical vapor deposition process or a spin-on process. Examples of low-k dielectric materials include "BLACK DIAMOND™" and "SILK™" materials. The low-k dielectric layer 22 may be formed on an underlying surface 26 of a wafer base 24, which may be, for example, a silicon wafer base, and may even substantially entirely cover the underlying surface 26 of the wafer base 24, as shown in FIG. 1a. The low-k dielectric layer 22 may comprise a substantially planar film (as shown) or may alternatively comprise a layer 22 having a plurality of etched features therein. The low-k dielectric layer 22 may also be formed over one or more side surfaces 28 of the wafer base 24 (not shown.)

A cleaning process is performed to remove the low-k dielectric layer 22 from the wafer 104, and may provide a surface 33 of the wafer that is substantially absent low-k dielectric residue. The cleaning process desirably removes the low-k dielectric layer 22 substantially without excessively eroding or otherwise damaging the underlying wafer 104, to allow the wafer to be re-used for subsequent testing and/or processing.

In one version, a method of cleaning the wafer 104 to remove the low-k dielectric layer 22 comprises exposing a surface 30 of the dielectric layer 22 to an oxygen-containing gas. Exposing the surface 30 to an oxygen-containing gas can oxidize the materials at the surface 30, such as Si—C and other chemical species. The low-k dielectric layer 22 may also comprise pores that allow the oxygen-containing to penetrate the layer and oxidize interior regions of the layer 22, for example, the layer 22 may have a porosity of from about 3% to about 30% by volume, and may comprise nano-sized pores. Oxidation of the surface 30 of the layer 22 can induce cracking and flaking of the layer 22 from the surface 30, thus removing portions of the low-k dielectric layer 22 form the wafer 104. A suitable oxygen-containing gas can comprise at least one of oxygen gas, ozone and water, and in one version may desirably be composed of oxygen gas ($O_2$).

In one version, the surface 30 of the dielectric layer 22 is exposed to oxygen-containing gas while heating the wafer 104 to a temperature that is sufficiently high to oxidize the surface 30 of the layer 22. A suitable temperature may be a temperature of at least about 700° C., such as from about 700° C. to about 1200° C. For example, the wafer 104 may be placed in a temperature controlled oven (not shown) having an oxygen-containing atmosphere with a high oxygen content, such as at least about 50% by volume oxygen. The oven may even be continuously purged with an oxygen-containing gas to maintain the high oxygen content. A suitable flow of an oxygen-containing gas into the oven, such as $O_2$, may be for example from about 4000 sccm to about 10,000 sccm.

In another version, the surface 30 of the dielectric layer 22 is exposed to an energized gas comprising energized oxygen-containing species to oxidize the surface 30. Oxygen-containing gases such as $O_2$ can be excited in a plasma to high energy singlet oxygen atoms that have high oxidation capability, and can also penetrate pores in the low-k dielectric layer 22 to oxidize the material. The oxygen containing gas can be energized by applying one or more of RF or microwave energy to the gas. For example, in one version, the wafer 104 may be placed in a process chamber (not shown), such as a barrel plasma etcher having at least one of electrodes, and inductor antenna, or microwave applicator that energize a gas to oxidize the surface 30. A suitable power level to energize the gas may be a power level of a least about 800 Watts, such as from about 800 Watts to about 3500 Watts, and even about 2800 Watts, for a gas pressure of from about 3 Torr to about 7 Torr. A suitable flow rate of the oxygen-containing gas in the chamber may be at least about 250 sccm, such as from about 250 sccm to about 500 sccm. While the surface 30 may be exposed to the energized gas at about 25° C., the temperature of the wafer 104 may also be increased to improve the oxidation rate and extent. For example, the wafer 104 may be heated to a temperature of at least about 350° C., such as from about 350° C. to about 500° C., during exposure to the energized gas.

Once the surface 30 of the low-k dielectric layer 22 has been exposed to the oxygen-containing gas, a chemical cleaning step can be performed to remove oxidized as well as unoxidized portions of the layer 22. The chemical cleaning step comprises immersing a surface 33 of the wafer 104, such as the surface of the low-k dielectric layer 22, in a chemical solution having a composition that is selected to etch and remove the layer 22, substantially without damaging or eroding underlying portions of the wafer 104. In one version, the chemical solution comprises silicon-removal component capable of acting on silicon-containing species in the dielectric layer 22, and a carbon-removal component that is capable of acting on carbon-containing species. The silicon and carbon-removal components operate together in the chemical solution to break bonds among both carbon and silicon-containing species in the dielectric layer 22, and thereby remove the low-k dielectric layer 22 from the wafer 104. In one version, a suitable silicon-removal component comprises HF, and a suitable carbon-removal component comprises $H_2SO_4$. For example, the solution can comprise a mixture of from about 1% to about 10% by weight of HF, and from about 30% to about 40% by weight of $H_2SO_4$. A desired molar ratio of HF to $H_2SO_4$ in the solution may be from about 1:10 to about 1:20. While in one version the chemical solution can consist essentially of HF and $H_2SO_4$, in other versions the chemical solution can comprise other components, such as for example at least one of $HNO_3$, $H_2O_2$ and $NH_4F$. A suitable immersion time may be from about 10 minutes to about 60 minutes. The chemical solution can remove a bulk portion of the dielectric layer 22, including any remaining oxidized as well as unoxidized portions of the layer 22, and comprises a composition that does not excessively erode the underlying wafer 104.

Figure 1B:
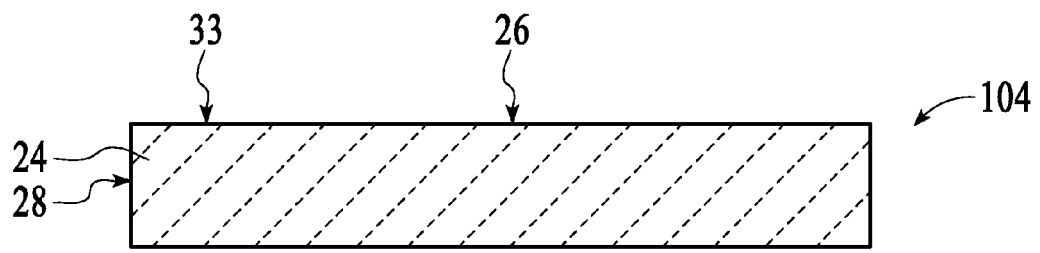
FIG. 1B is a partial sectional side view of the wafer of FIG. 1A after a cleaning process to remove the low-k dielectric material.

Once the surface 30 has been immersed in the chemical solution to remove the low-k dielectric layer 22 from the wafer 104, a subsequent cleaning step can be performed to etch and remove low-k dielectric residues remaining on the wafer 104, to provide a substantially clean wafer top surface 33, as shown for example in FIG. 1b. In one version, the cleaning step comprises removing organic residues that remain on the wafer 104 from the dielectric layer 22, and which may not have been completely removed by the previous immersion in the chemical solution. An example of a cleaning step to remove remaining low-k dielectric layer residues comprises immersing a surface 33 of the wafer 104 having low-k dielectric layer residues thereon in a solution comprising a composition of $H_2SO_4$ and $H_2O_2$, which may be also known as a Piranha solution. A suitable solution may comprise a concentration equivalent to, for example, a solution formed by combining a 96% w/w solution of $H_2SO_4$ (concentrated $H_2SO_4$) with a 30% w/w solution of $H_2O_2$, in a volumetric ratio of the 98% w/w $H_2SO_4$ solution to the 30% w/w $H_2O_2$ solution of from about 7:3 to about 50:1, such as for example about 4:1. Thus, a suitable molar ratio of $H_2SO_4$ to $H_2O_2$ may be from about 1.4:1 to about 31:1, such as about 2.5:1. A temperature of the solution may be maintained sufficiently high to promote reactions between the solution and remaining low-k dielectric layer residues to remove the residues. For example, the temperature may be at least about 120° C. In yet another version, the surface 33 of the wafer can be exposed to an energized oxygen-containing gas, for example in a plasma barrel etcher, to remove any low-k dielectric residues such as organic residues that remain after cleaning with a chemical solution.

In yet a further version, the wafer 104 may be cleaned by alternating cleaning of the wafer surface 33 with a first cleaning solution comprising a component that breaks Si—O bonds, and a second solution comprising a component that breaks Si—C bonds, to remove low-k dielectric residues from the surface. For example, the surface 33 of the wafer may be immersed in a first solution comprising at least one of HF and $NH_4F$, such as a solution of HF having a concentration of from about 1% to about 10% by weight to break Si—O bonds on the surface 33. The surface 33 may then be immersed in a second solution comprising $H_2SO_4$ and $H_2O_2$, such as the Piranha solution, to break remaining Si—C bonds to remove remaining low-k dielectric residues. The wafer 104 may also be immersed in the solutions in a different order, and the cleaning steps may be repeated until the low-k dielectric layer 22 has been substantially entirely removed. In general, the cleaning solutions desirably comprise compositions that are capable of effectively breaking bonds in the low-k dielectric material, such as Si—O, Si—$CH_3$ and C—O bonds, to remove the low-k dielectric layer 22 substantially without leaving a residue on the wafer surface 33 that could be difficult to remove and could inhibit further testing/processing of the wafer 104.

In one version, the low-k dielectric layer 22 is removed from the wafer 22 by a cleaning step that involves grinding the dielectric layer 22 by a fine grinding method. A fine grinding method can be effective to remove the low-k dielectric layer 22 because the dielectric layer 22 is typically relatively structurally soft in comparison to the base 24, and thus can be removed by fine-grinding substantially without removing excessive material from the wafer base 24. In one version of a fine grinding method, the surface 30 of the dielectric layer 22 is ground against an abrasive surface 32, such as an abrasive wheel 34, comprising bonded particles of abrasive material that are capable of grinding away and removing the low-k dielectric layer 22 from the wafer 104, as shown for example in FIGS. 2a and 2b. The abrasive material can comprise, for example, particles of at least one of diamond and cubic boron nitride material, which can be bonded to the surface 32 through, for example, a vitrified bond, resin bond or metal bond. The bonded particles are typically sized to provide the desired low-k dielectric material removal, substantially without excessively damaging or scratching the underlying wafer surface 26. For example, the bonded particles may comprise a size of from about 1 micrometer to about 6 micrometers. The abrasive material bonded to the surface 32 is capable of grinding the low-k dielectric layer 22 from the wafer 104 substantially without providing a grinding slurry between the layer 22 and the abrasive surface 32, which reduces the amount of clean-up required to refresh the wafer surface 33. The fine grinding method is also an improvement over previous grinding methods, as the fine grinding method allows for grinding substantially without generating excessive subsurface damage, as in other harsher bulk grinding methods.

Figures 2A, 2B:
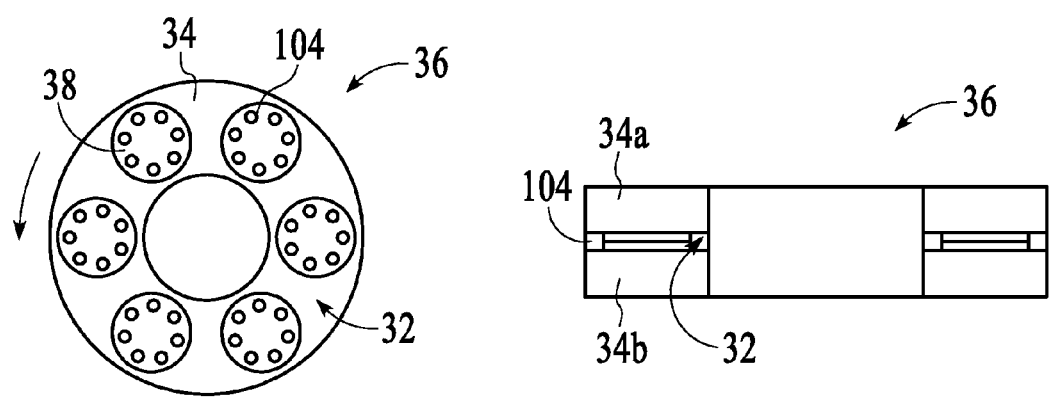
FIG. 2A is a partial top view of an embodiment of a fine grinding apparatus.
FIG. 2B is a partial sectional side view of the fine grinding apparatus of FIG. 2A.

An embodiment of a fine grinding apparatus 36 is shown in FIGS. 2a and 2b. This embodiment may be illustrative of an apparatus capable of performing a Peter Wolters fine grinding method, according to a design by Peter Wolters A. G., Rendsburg, Germany. A suitable apparatus may be, for example, Nanogrinder/4 or Multinano/3-300 commercially available from Peter Wolters A. G. The apparatus 36 comprises upper and lower grinding wheels 34a,b, one or more of which has bonded particles of abrasive material thereon. A plurality of wafer carriers 38 are provided that are adapted to guide wafers 104 in a path between the wheels 34a,b. The wafer carriers 38 can be rotated to move the carriers in an orbiting circular path between the wheels 34a,b, while rotating the wafers 104 against the abrasive surfaces 32 of one or more of the upper and lower wheels 34a,b in a circular motion. A cooling fluid can also be provided between the wafers 104 and wheels 34a,b to inhibit overheating of the wafer 104 due to frictional forces. The grinding apparatus 36 can thus remove material from the wafer 104 to provide the desired low-k dielectric removal results.

The fine grinding method can be used to remove a sufficient amount of the low-k dielectric layer 22 substantially without generating excessive sub-surface damage that could inhibit further use of the wafer 104, and without excessively etching or grinding away the wafer material. The fine grinding method may be capable of removing a thickness of from about 1 to about 6 micrometers of material. For example, for a low-k dielectric layer 22 having a thickness of from about 0.5 micrometers to about 4 micrometers, the fine grinding method may remove a thickness of less than about 4 micrometers of material from the wafer 104, such as from about 0.5 to about 4 micrometers. Thus, the fine grinding method may remove a thickness of from about 50% to about 100% of the original thickness of the low-k dielectric layer 22. Any subsurface damage that may be generated by the fine-grinding method is desirably low enough to allow for a subsequent polishing removal to remove any vestiges of grind marks without requiring the removal of an excessive amount of material from the wafer 104. For example, the sub-surface damage may be low enough to be removed by polishing away a thickness of less than about 8 micrometers of material from the wafer 104, which may include silicon material from a silicon base 24, and desirably less than about 4 micrometers of material, such as a thickness of from about 3 to about 4 micrometers. Thus, the method allows for suitable preparation of the wafer surface 33 without eroding an excessive amount of material from the wafer.

Figure 3:
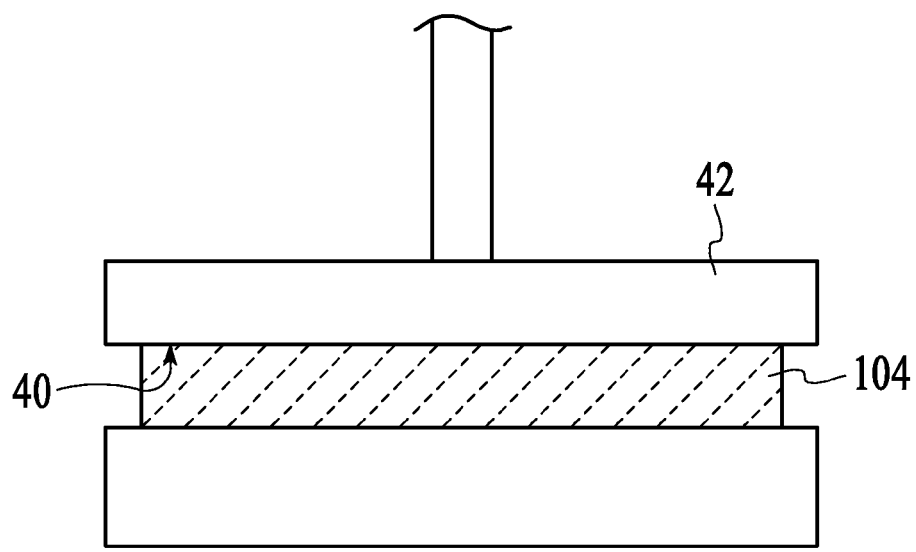
FIG. 3 is a partial sectional side view of an embodiment of a polishing pad and wafer.

A suitable polishing method may be, for example, a chemical mechanical polishing method, in which the surface 33 of the wafer 104 is rotated against a polishing surface 40 of a polishing pad 42, while a chemical slurry is provided between the pad 42 and wafer 104 to chemically and mechanically remove material from the wafer, as shown for example in FIG. 3. For example, a polishing pad comprising a Suba™ 1500 or a SPM 2000, both of which are commercially available from Rodel, Phoenix Ariz., U.S.A. could be provided in combination with a slurry having abrasive particles of silica ranging in size from about 0.05 micrometers to about 0.2 micrometers in a deionized water slurry solution, such as the Mazin® 3300 slurry commercially available from DA Nanomaterials L.L.C., Tempe Ariz., U.S.A. The chemical mechanical polishing process desirably provides a sufficiently polished wafer 104 having a smooth and substantially scratch-free wafer surface 33 that is suitable for subsequent processing and/or testing.

In one version, removal of the low-k dielectric layer 22 from the wafer 104 can be achieved by polishing the wafer 104 with a polishing pad 42 having a relatively high hardness. The hard polishing pad 42 takes advantage of the relative structural softness of the low-k dielectric layer 22, to remove the layer 22 substantially without excessively scratching or damaging the underlying wafer surface 26. The polishing pad can comprise a hardness of, for example, at least about 40 JIS A hardness, such as from about 60 to about 80 JIS A hardness, and even about 92 JIS A hardness. The term "JIS A hardness" as used herein means a numeric value as measured by using a durometer hardness test machine of type A as defined by JIS K 6253:1997. A suitable pad 42 having the desired hardness may be, for example, a Rodel® MH polishing pad and may also be Rodel Suba™ 1200 pad, both of which are commercially available from Rodel, Phoenix Ariz., U.S.A.

In the polishing process, the surface 33 of the wafer 104 is typically rotated against the polishing surface 40 of the high-hardness polishing pad 42, and a slurry is provided between the pad 42 and wafer 104. A suitable slurry for polishing with the high-hardness polishing pad may be a slurry having slurry particles comprising silica in a chemical solution comprising KOH, which may comprise a pH value of about 11. The wafer 104 can be polished with the high-hardness pad 42 until a sufficient amount of the low-k dielectric layer 22 has been removed, such as from about 20% to about 50% of the thickness of the low-k dielectric layer 22, and even 100% of the thickness, which may be from about 0.5 micrometers to about 4 micrometers of the dielectric layer 22. The relatively high hardness pad does not excessively scratch the surface 33 of the wafer 104, and thus can provide satisfactory removal of the low-k dielectric layer 22 without damaging or excessively eroding the underlying surface 26, as shown in FIG. 1b. Polishing with the high hardness polishing pad 42 can thus be performed to remove substantially the entire dielectric layer 22 on the wafer 104, or may be performed in combination with one or more other cleaning steps. For example, the wafer 104 may be polished with the polishing pad after an initial fine grinding or other grinding process is performed to remove any remaining low-k dielectric layer residues as well as any surface imperfections that may remain on the wafer 104 after the fine grinding process. A final polishing process can be performed after the high hardness polishing step to refresh and renew the wafer surface 33, and may comprise a light polish with a relatively soft polishing pad 42, such as a UR 100 pad commercially available from Rodel, Phoenix Ariz., U.S.A.

In one version, one or more of the cleaning steps comprising the solutions capable of removing the low-k dielectric layer 22 are combined with any of the steps described above. For example, the wafer 104 may be cleaned by a chemical solution before or after one or more of a fine grinding step, high hardness polishing step and oxidation step. In another version, one or more chemical solution cleaning steps can be performed separately, substantially without previously heating, oxidizing or grinding the wafer 104. Suitable solutions can comprise, for example, least one of HF, $NH_4F$, $HNO_3$, $H_2SO_4$ and $H_2O_2$, wherein the concentrations of the solution components are selected to remove the remaining dielectric layer 22 substantially without excessively etching the wafer 104 beneath the dielectric layer, and substantially without leaving low-k dielectric residues remaining on the wafer 102. Furthermore, combinations of the fine grinding, high hardness polishing, and oxidation processes may also be performed to achieve the desired cleaning results.

Figure 4:
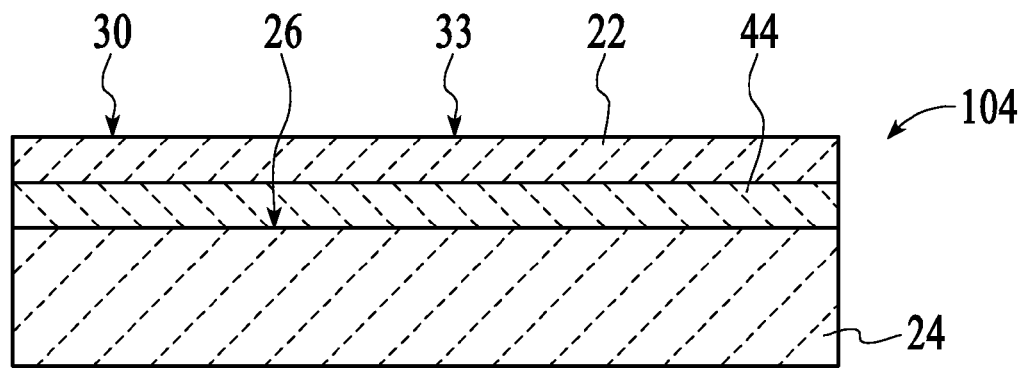
FIG. 4 is a partial sectional side view of an embodiment of a wafer having a low-k dielectric layer over a removable layer.

In another version, a method is provided for reclaiming and refreshing wafers 104 that involves providing a removable layer 44 between the low-k dielectric layer 22 and underlying wafer base 24, to allow easier removal of the low-k dielectric layer 22, as shown for example in FIG. 4. The removable layer 44 comprises a material that can be readily removed from the wafer 104 when desired, for example by etching the removable layer 44. The removable layer 44 comprises a material that is more easily removed than the low-k dielectric layer 22, and is also desirably a material that can be removed substantially without excessive erosion of the underlying wafer base 24. The readily removable layer 44 allows for the low-k dielectric layer to be "lifted-off" the wafer 104 simultaneously with the removable layer 44, and thus provides for easy removal of the low-k dielectric layer without requiring removal means that are specific to low-k materials.

In this version, a removable layer 44 is formed over the base 24 of the wafer 104, such as over substantially the entire underlying surface 26 of the wafer 104. The removable layer 44 may be formed on the wafer 104 by, for example, a deposition method, such as a chemical or physical deposition method, and may also be "grown" on the wafer 104, for example by an epitaxial layer growth method. An example of a suitable removable layer 44 comprises a layer of silicon oxide having a thickness of from about 0.5 micrometers to about 2 micrometers. The wafer 104 having the removable layer 44 formed thereon can be used for testing and/or processing purposes. For example, the wafer 104 can be used to test process results for the deposition of a low-k dielectric layer 22 on the wafer 104, and may also be used to test results for the etching of such a low-k dielectric layer 22. The low-k dielectric layer 22 is formed over the removable layer 44, and is spaced apart from the wafer base 24 by the removable layer 44, as shown in FIG. 4.

To remove the low-k dielectric layer 22, for example to refresh and/or reclaim the wafer 104, at least a portion of the removable layer 44 is immersed in an etching solution having a composition that is capable of etching the removable layer 44. The etching solution is preferably capable of etching the removable layer 44 substantially without etching the underlying wafer base 24. The low-k dielectric layer 22 is "lifted off" of the wafer 104 by the removal of the removable layer, and may also be at least partially etched and removed by the etching solution. In one version, a suitable etching solution comprises HF, and may even comprise a buffered hydrofluoric acid solution (BHF) comprising HF and $NH_4F$. For example, the etching solution may comprise HF having a concentration of from about 5% to about 49% by weight. In one version, a suitable BHF solution is a solution equivalent to a mixture of 40% by weight $NH_4F$ and 49% by weight HF in a volumetric ratio $NH_4F$ to HF of about 6:1. The removable layer 44 may be immersed in the etching solution for from about 0.5 minutes to about 60 minutes to remove the layer 44. One or more post-etching steps may be performed to prepare the wafer surface 33 for subsequent testing and/or processing. For example, the surface 33 of the wafer 104 may be subjected to at least one of a rinsing step and polishing step to refurbish the wafer 104. Once the wafer surface 103 has been refurbished, the removable layer 44 can be re-formed on the surface 26 of the wafer base 24 to allow further testing and deposition of low-k dielectric layers 22 on the wafer 22.

Additionally, the cleaning steps described above can be combined to provide cleaning processes suitable for removing low-k dielectric layers 22. For example, the removable layer 44 may be used along with one or more of an oxidation, fine grinding and high hardness polishing process to remove the low-k dielectric layer 22. Accordingly, while preferred embodiments have been described herein, the cleaning method should not be limited to those combinations specifically described herein.

Figure 5:
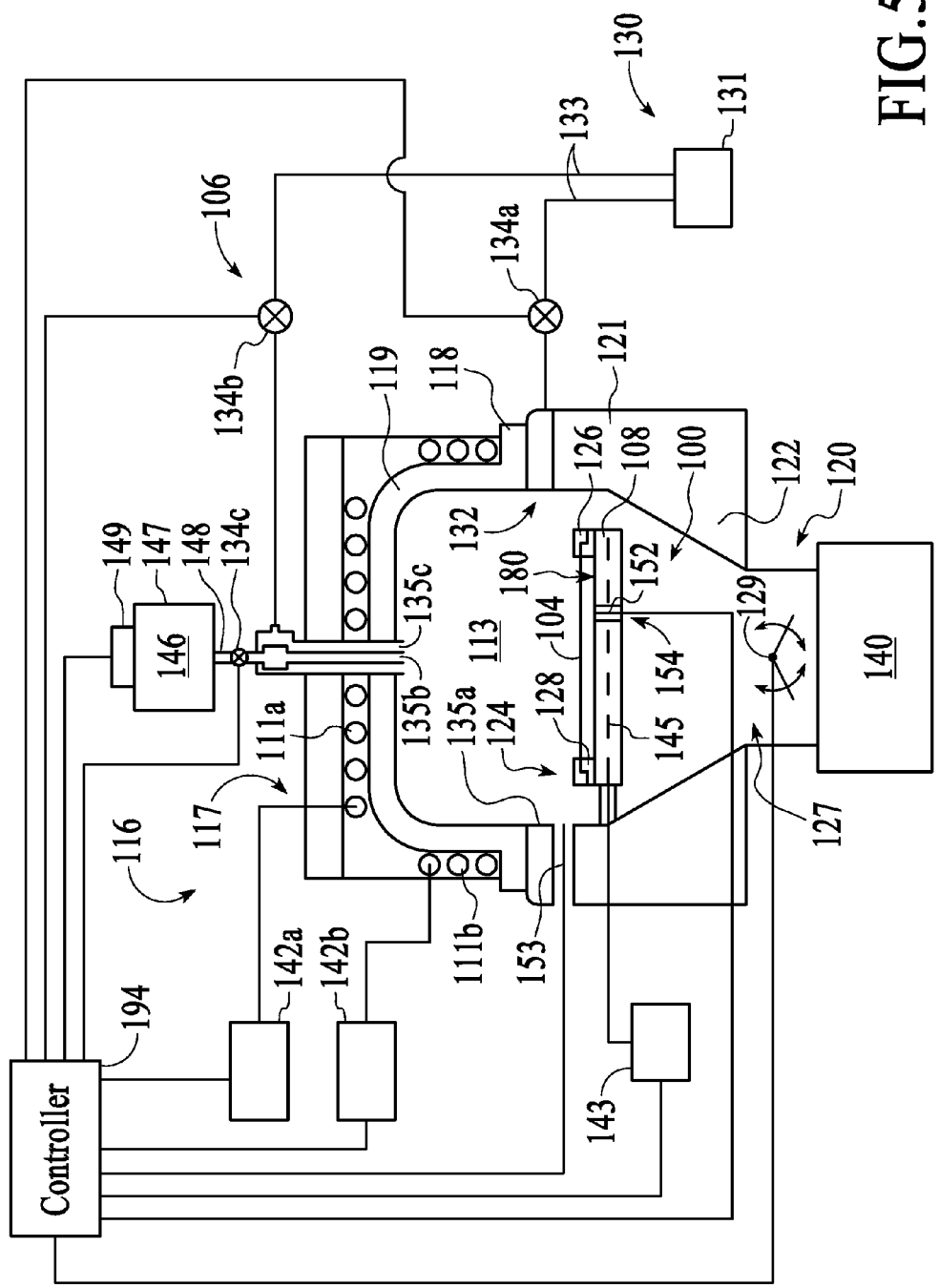
FIG. 5 is a partial sectional side view of an embodiment of a process chamber.

An apparatus 102 suitable for forming the low-k dielectric layer 22 on the wafer 104 may be a chemical vapor deposition chamber 106, an embodiment of which is shown for example in FIG. 5. The chamber 106 may be capable of re-forming the low-k dielectric layer 22 on a wafer 104 that has been cleaned, and may also be capable of depositing a low-k dielectric layer 22 on a fresh wafer 104. The chamber shown in FIG. 5 comprises enclosure walls 118, which may comprise a ceiling 119, sidewalls 121, and a bottom wall 122 that enclose a process zone 113. The enclosure walls 118 can comprise a domed ceiling 119 over the process zone 113. A deposition gas can be introduced into the chamber 106 through a gas supply 130 that includes a deposition gas source 131, and a gas distributor 132. In the version shown in FIG. 5, the gas distributor 132 comprises one or more conduits 133 having one or more gas flow valves 134a,b and one or more gas outlets 135a around a periphery of the wafer 104, as well as one or more outlets 135b,c above the wafer 104 to provide an optimized flow of deposition gas in the chamber 106. An electrode 145 in an electrostatic chuck 108 of a substrate support 100 may be powered by an electrode power supply 143 to electrostatically hold a wafer on the support surface 180 during processing. Spent process gas and process byproducts are exhausted from the chamber 106 through an exhaust 120 which may include an exhaust conduit 127 that receives spent process gas from the process zone 113, a throttle valve 129 to control the pressure of process gas in the chamber 106, and one or more exhaust pumps 140.

In one version, the support 100 also comprises a process kit 124 comprising one or more rings, such as a cover ring 126 and a collar ring 128 that covers at least a portion of the upper surface of the support 100 to inhibit erosion of the support 100. A lift pin assembly 154 and wafer transport 153 can also be provided to position the wafer 104 on a wafer receiving surface 180 of the support 100. The lift pin assembly 154 comprises a plurality of lift pins 152 adapted to contact the underside of the wafer 104 to lift and lower the substrate 104 onto the wafer receiving surface 180. The wafer transport 153 is adapted to transport wafers 104 in and out of the process chamber 106.

In one version, the deposition gas may be energized to process the wafer 104 by a gas energizer 116 comprising an antenna 117 having one or more inductor coils 111a,b which may have a circular symmetry about the center of the chamber to couple energy to the process gas in the process zone 113 of the chamber 106. For example, the antenna 117 may comprise a first inductor coil 111a about a top portion of the domed ceiling 119 of the chamber 106, and a second inductor coil 111b about a side portion of the domed ceiling 119. The inductor coils may be separately powered by first and second RF power supplies 142a,b. The gas energizer 116 may also comprise one or more process electrodes that may be powered to energize the process gas. A remote chamber 147 may also be provided to energize a process gas, such as a cleaning gas, in a remote zone 146. The process gas can be energized by a remote zone power supply 149, such as a microwave power supply, and the energized gas can be delivered via a conduit 148 having a flow valve 134c to the chamber 106, for example to clean the chamber.

To process a wafer 104, for example by forming a low-k dielectric layer 22 on the wafer 104, the process chamber 106 is evacuated and maintained at a predetermined sub-atmospheric pressure. The wafer 104 is then provided on the support 100 by a wafer transport 153, such as for example a robot arm, and lift pin assembly 154. The wafer 104 may be held on the support 100 by applying a voltage to an electrode in the support 100 via an electrode power supply 143. The gas supply 130 provides a process gas to the chamber 106 and the gas energizer 116 couples RF or microwave energy to the process gas to energize the gas to process the wafer 104. Effluent generated during the chamber process is exhausted from the chamber 106 by the exhaust 120.

The chamber 106 can be controlled by a controller 194 that comprises program code having instruction sets to operate components of the chamber 106 to process wafers 104 in the chamber 106. For example, the controller 194 can comprise a wafer positioning instruction set to operate one or more of the wafer support 100 and wafer transport 153 and lift pins 152 to position a wafer in the chamber 106; a gas flow control instruction set to operate the gas supply 130 and flow control valves to set a flow of gas to the chamber 106; a gas pressure control instruction set to operate the exhaust 120 and throttle valve to maintain a pressure in the chamber 106; a gas energizer control instruction set to operate the gas energizer 116 to set a gas energizing power level; a temperature control instruction set to control temperatures in the chamber 106; a cleaning control instruction set to set a voltage applied to the electrode 145 to generate an electrostatic force to press the wafer 104 against the support surface 180; and a process monitoring instruction set to monitor the process in the chamber 106.

The present invention has been described with reference to certain preferred versions thereof; however, other versions are possible. For example, the wafer 104 can be used in other types of applications, as would be apparent to one of ordinary skill. Other types of cleaning steps can also be used. Further, alternative steps equivalent to those described for the cleaning process can also be used in accordance with the parameters of the described implementation, as would be apparent to one of ordinary skill. Therefore, the spirit and scope of the appended claims should not be limited to the description of the preferred versions contained herein.

What is claimed is:

1. A method of refurbishing a wafer comprising a low-k dielectric layer, the low-k dielectric layer having a k value of less than about 3 and comprising silicon, oxygen and carbon, the method comprising:
   (a) providing a removable layer on the wafer;
   (b) forming the low-k dielectric layer over the removable layer; and
   (c) etching the removable layer from the wafer by at least partially immersing the wafer in an etching solution, thereby removing the overlying low-k dielectric layer from the wafer.

2. A method according to claim 1 wherein (a) comprises providing a removable layer comprising silicon oxide.

3. A method according to claim 2 comprising providing the silicon oxide in a thickness of from about 0.5 to about 2 micrometers.

4. A method according to claim 1 wherein (a) comprises forming the removable layer on the wafer by chemical or physical deposition.

5. A method according to claim 1 wherein (a) comprises forming the removable layer on the wafer by epitaxial growth.

6. A method according to claim 1 wherein (c) comprises at least partially immersing the wafer in an etching solution comprising HF.

7. A method according to claim 6 wherein the etching solution comprises buffered hydrofluoric acid solution.

8. A method according to claim 1 wherein the etching solution comprises HF in a concentration of from about 5% to about 49% by weight.

9. A method according to claim 1 wherein (c) comprises at least partially immersing the wafer in an etching solution comprising HF and $NH_4F$.

10. A method according to claim 9 wherein the etching solution comprises a mixture of 40% by weight $NH_4F$ and 49% by weight HF.

11. A method according to claim 9 wherein the etching solution comprises a volumetric ratio of $NH_4F$ to HF of about 6:1.

12. A method according to claim 1 wherein (c) comprises at least partially immersing the wafer in the etching solution for from about 0.5 minutes to about 60 minutes.

13. A method according to claim 1 wherein the etching solution comprises (i) $H_2SO_4$, or (ii) HF or $H_2O_2$.

14. A method according to claim 1 further comprising chemical mechanical polishing the wafer by:
   (a) rotating the surface of the wafer against a polishing pad having a hardness of at least about 40 JIS A; and
   (b) applying a polishing slurry between the wafer and the polishing pad.

15. A method according to claim 1 further comprising fine grinding the low-k dielectric layer with a grinding surface comprising bonded particles of abrasive material comprising diamond or cubic boron nitride.

16. A method according to claim 1 further comprising exposing the surface of the low-k dielectric layer to an oxygen-containing gas to oxidize the surface.

17. A method according to claim 1 further comprising:
   (d) re-forming the removable layer and overlying low-k dielectric layer on the wafer.

18. A method according to claim 1 further comprising the initial steps of (1) processing a wafer comprising a test wafer to form the low-k dielectric layer on the wafer, and (2) determining at least one of a thickness, particle count, or composition of the low-k dielectric layer on the test wafer.

19. A method according to claim 1 wherein the wafer comprises a production wafer having a processed low-k dielectric layer.

20. A method of refurbishing a wafer comprising a low-k dielectric layer having a k value of less than about 3 and comprising silicon, oxygen and carbon, the method comprising:
   (a) providing a removable layer comprising silicon oxide on the wafer;
   (b) forming the low-k dielectric layer over the removable layer; and
   (c) etching the removable layer from the wafer by at least partially immersing the wafer in an etching solution comprising HF, thereby removing the overlying low-k dielectric layer from the wafer.

21. A method according to claim 20 wherein the etching solution comprises buffered hydrofluoric acid solution.

22. A method according to claim 20 wherein etching solution comprises HF and $NH_4F$.

* * * * *